United States Patent
Abdo

(10) Patent No.: US 7,900,169 B2
(45) Date of Patent: Mar. 1, 2011

(54) OPC MODEL CALIBRATION PROCESS

(75) Inventor: Amr Y. Abdo, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/349,094

(22) Filed: Jan. 6, 2009

(65) Prior Publication Data

US 2010/0171036 A1    Jul. 8, 2010

(51) Int. Cl.
G06F 17/50 (2006.01)
G01N 23/00 (2006.01)

(52) U.S. Cl. .......... 716/19; 716/21; 250/252.1; 250/307; 430/5; 702/85; 382/195

(58) Field of Classification Search .......... 716/19, 716/21; 430/5; 250/307, 252.1; 382/195; 702/85
See application file for complete search history.

(56) References Cited

U.S. PATENT DOCUMENTS

| | | | |
|---|---|---|---|
| 6,519,501 B2 | 2/2003 | Pierrat et al. | |
| 6,602,728 B1 | 8/2003 | Liebmann et al. | |
| 6,749,972 B2 | 6/2004 | Yu | |
| 6,934,929 B2 | 8/2005 | Brist et al. | |
| 6,988,259 B2 | 1/2006 | Pierrat et al. | |
| 6,996,797 B1 | 2/2006 | Liebmann et al. | |
| 2005/0188338 A1 | 8/2005 | Kroyan et al. | |
| 2005/0273753 A1 | 12/2005 | Sezginer | |
| 2006/0023932 A1 | 2/2006 | DeMaris et al. | |
| 2006/0101370 A1 | 5/2006 | Cui et al. | |
| 2006/0110837 A1 | 5/2006 | Gupta et al. | |
| 2008/0301620 A1* | 12/2008 | Ye et al. | 716/19 |
| 2009/0193387 A1* | 7/2009 | Mukherjee et al. | 716/21 |
| 2010/0005440 A1* | 1/2010 | Viswanathan et al. | 716/19 |
| 2010/0171031 A1* | 7/2010 | Graur et al. | 250/252.1 |

* cited by examiner

Primary Examiner—Nikita Wells
(74) Attorney, Agent, or Firm—Joseph Petrokaitis

(57) ABSTRACT

A method of calibrating a model of a lithographic process includes a plurality of test features each having different widths that vary from a resolvable feature width that is known to be resolvable by the lithographic process, to a width that is known not to be resolvable by the lithographic process. The test features and patterns are specifically designed to include features that approach or exceed the resolution of the lithographic process, and range from known resolvable patterns to patterns that are expected to fail to be resolved. The printed test patterns are inspected for printability and the extremum intensity values associated with neighboring printable and non-printable test patterns are used to determine a constant threshold value to be used in a resist process model.

12 Claims, 12 Drawing Sheets

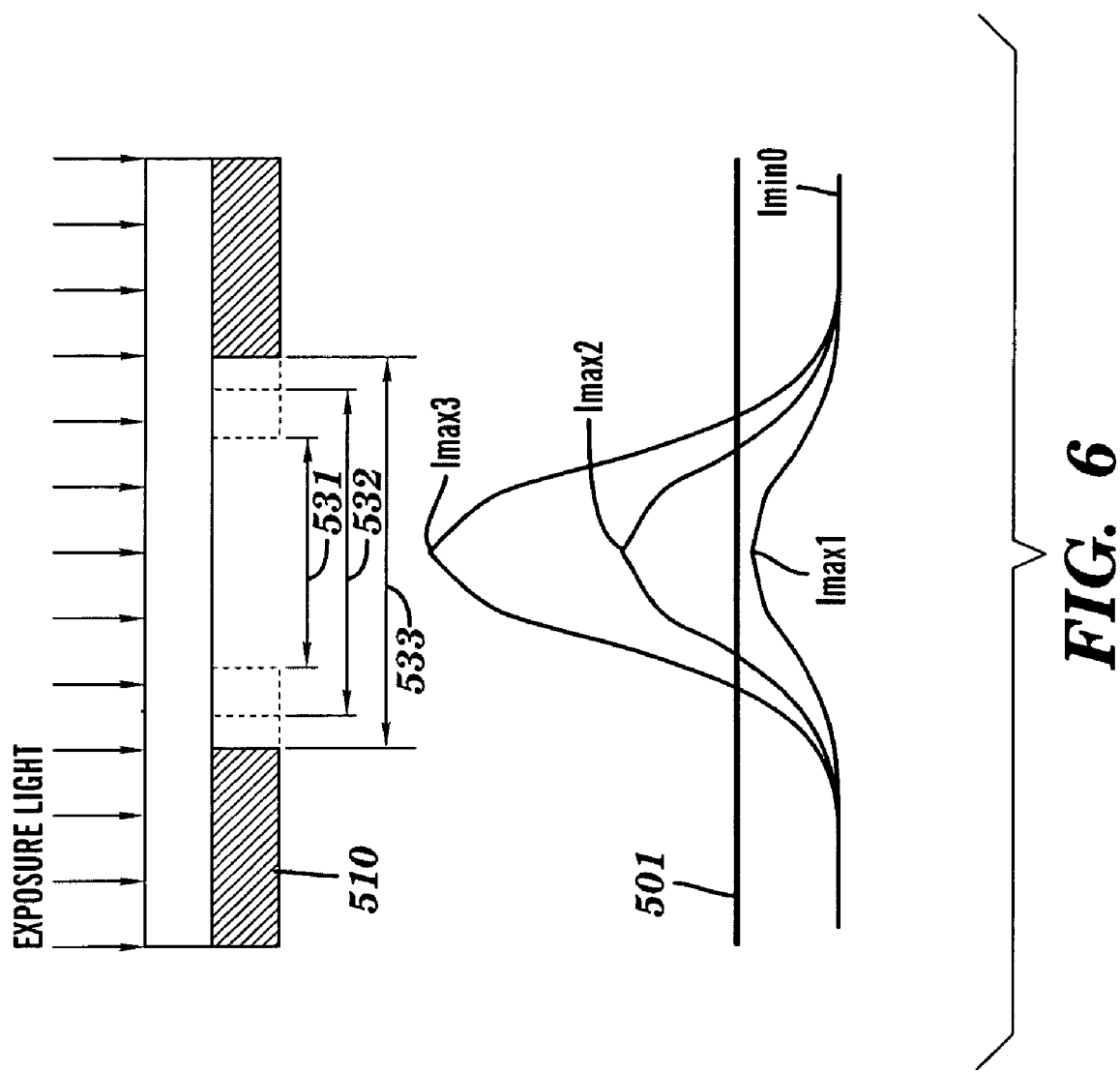

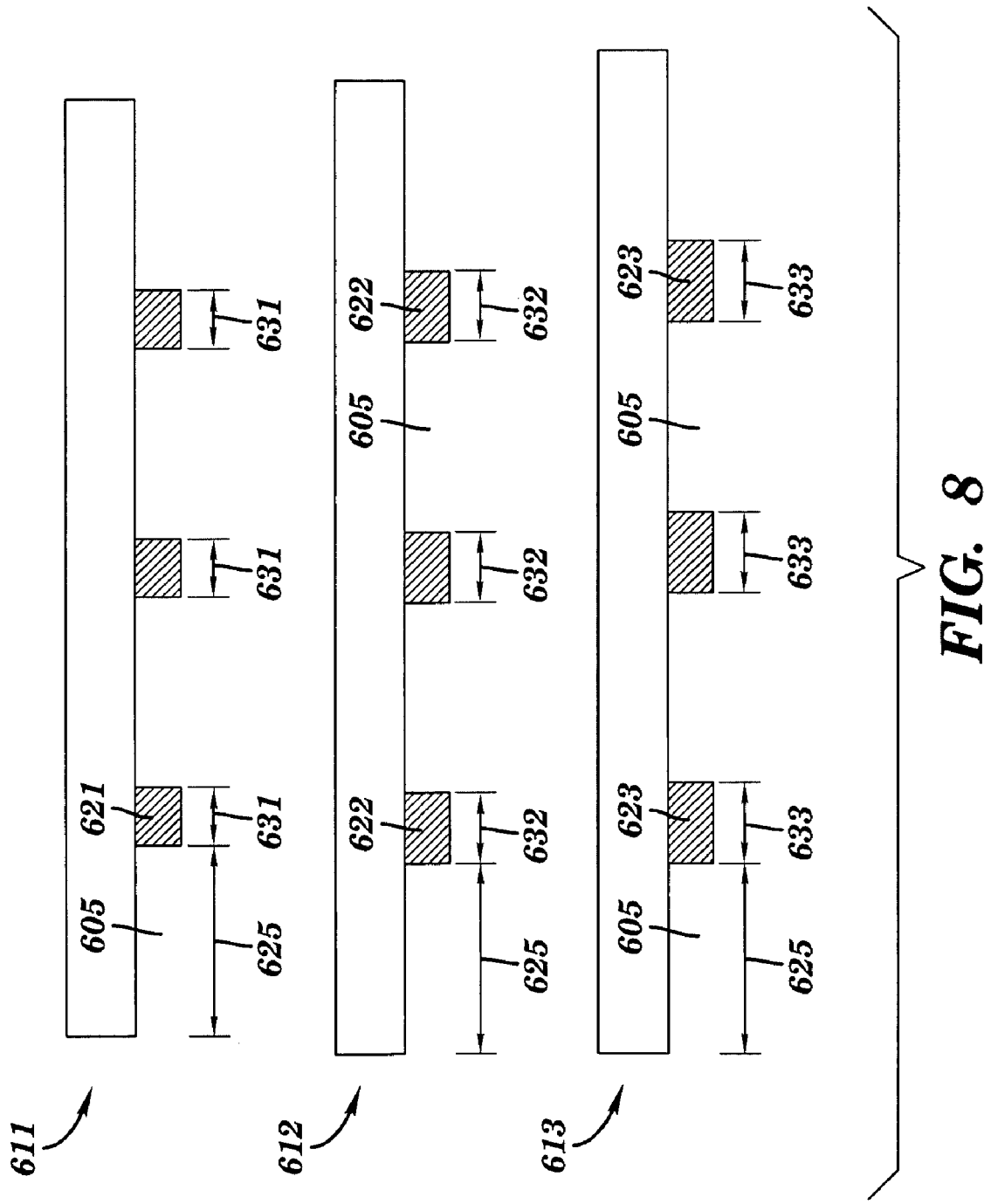

OPC MODEL CALIBRATION PROCESS

BACKGROUND OF THE INVENTION

1. Field of the Invention

The present invention generally relates to semiconductor chip manufacturing, and more particularly to a method for calibrating an optical proximity correction model used for printing a circuit pattern on a semiconductor wafer.

2. Description of the Related Art

Optical Proximity Correction (OPC) uses calibrated optical and resist models to modify the shapes on the mask so that the printed shapes on the wafer will closely match the desired target shapes, within acceptable criteria. OPC optical and resist models are developed through an empirical method using a model calibration process in which test structures (also called calibration structures), that are intended to be a representative set of the actual product patterns, are placed on a test mask. Thus, the calibration test patterns consist of features that have dimensions that are desired to be printed on the wafer. The test mask is then exposed and the wafer image is measured and used as input in the model calibration and building process.

Optical model calibration is performed using direct measurements of the printed test pattern exposed by the illumination source. Referring to FIG. 1A, energy 100 from the illumination source (not shown) illuminates a cross-section view of a portion of an dark field mask 200 that has a substantially opaque field region 210 and transparent region 205, representing a feature to be printed, through which the illumination energy is transmitted to the resist on a wafer substrate. The plot 300 schematically illustrates the intensity I of illumination energy for various exposure dose settings (Dose1, Dose2, Dose3) along the horizontal direction x. A resist image will be formed when the intensity I of the light equals or exceeds a threshold value 15 at which the resist will develop. As the energy dose, or equivalently, the intensity, increases (from Dose3 to Dose1), the extent of energy that exceeds the threshold increases, e.g. from Dose3 to Dose2 to Dose1, and the corresponding dimension printed on the wafer, i.e. CD3 to CD2 to CD1, respectively, of the pattern image formed on the wafer increases.

A constant threshold resist model assumes that the threshold for image development is constant across the wafer. However, in practice, the constant threshold model does not necessarily represent the actual behavior of the resist across the wafer. To account for such variations, a typical resist model uses is a "variable threshold resist model". A variable threshold model uses a fitting polynomial to correct the deviation from the constant threshold and find the best value for each feature threshold that makes the predicted CDs of the pattern match as closely as possible the experimentally measured CDs of pattern features printed using the test mask.

A variable threshold model may be represented by Equation 1:

$$\text{Variable Threshold} = \text{Constant Threshold} + \text{Correction Polynomial} \quad (1)$$

The variable threshold model comprises a constant threshold plus a correction polynomial, as in Equation 1. The independent variables in the correction polynomial are image parameters, such as Imin, Imax, slope, etc., as known in the art. The calibration process includes determining the values of the constant threshold and the coefficients of the correction polynomial. These are determined by finding, for all of the features in the test pattern, a best fit of measured CDs to the CDs predicted by the model. This calibration usually includes performing a simulation of the optical image produced by the test pattern. Then, referring to FIG. 1B, the maximum intensity (Imax) and the minimum intensity (Imin) are determined for each feature in the test pattern from the simulated optical image. Imax is the maximum intensity in the neighborhood of the simulated image of feature 205 on the mask 200, and similarly, Imin is the minimum intensity in the neighborhood of the simulated image of feature 205. The resulting values of Imax and Imin may be plotted as a function of pattern feature number, for example, as illustrated in FIG. 2A. It is generally expected that the Imax values are confined to a region 201 of the plot, while the Imin values are confined within a second region 202 of the plot that does not overlap with the intensities of the region 201 comprising the Imax values. The constant threshold should be identified within the gap region 203 between the region 201 consisting of Imax values, and bounded below by a minimum Imax intensity value, and the region 202 consisting of Imin values and bounded above by a maximum Imin value, for the entire test pattern. The gap region 203 has a finite width based on the range of feature sizes in prior art test patterns that reflect the dimensions of circuit features to be printed.

However, selecting a single, accurate constant threshold intensity value within the finite gap 203 is generally performed by trial and error, which may not provide a sufficiently accurate result. For example, FIG. 3 illustrates a comparison of overlays of simulated images to a scanning electron microscope (SEM) image 300 of a feature printed on the wafer. Each of the three simulated image contours 311, 312 and 313 are from a variable resist model, each having a different constant threshold value that was chosen within the gap between Imin and Imax in a plot similar to that of FIG. 2. The shortest contour image 311 results from using a constant threshold value of about 0.225, the middle contour image 312 resulted from using a larger constant threshold value of about 0.25, and the longest contour image 313 resulted from using an even larger constant threshold value of about 0.275. Each of these constant threshold values occur within the acceptable gap of a plot similar to FIG. 2 typically formed according to prior art calibration methods. It can be seen that the variable threshold model using the larger constant threshold value of 0.275 resulted in an image 313 that more closely matches the actual SEM image, and that merely choosing the constant threshold value can result in significant deviations in the predicted image contour. As can be seen, a slight variation in the constant threshold value may result in a very different prediction of the wafer image.

In view of the foregoing considerations, there is a need for a method to identify reliably an accurate constant threshold for a given process that can be used in a variable threshold resist model that may be used during the mask design process, for example, in OPC or mask verification methodologies.

SUMMARY OF THE INVENTION

According to one aspect of the invention, a method of calibrating a model of a lithographic process is provided, the method comprising the steps of: providing a plurality of test features of a first tone each of said test features having a different feature width each defined by a distance between two adjacent background features of a second tone, wherein a first of said test features has a first resolvable feature width that is known to be resolvable by the lithographic process, and each subsequent one of said plurality of test features comprises a subsequent feature width that is smaller than said first resolvable feature width and different than any other feature width of said plurality of test features; forming a resist image of said plurality of test features according to the lithographic process; identifying from among said plurality of test features in said resist image a first printable feature width in accordance with an acceptable printability criterion and a first unprintable feature width in accordance with an unacceptable printability criterion; determining a printability extremum intensity value associated with said first printable feature width and an unprintability extremum intensity value associated with said first unprintable feature width; and selecting a constant threshold value based on a combination of said extremum intensity values, said constant threshold value for use in a constant threshold model of behavior of said resist in said lithographic process.

According to another aspect of the invention, a plurality of test patterns is provided, wherein each of said test patterns comprises a plurality of one of said plurality of test features having a given feature width.

In yet another aspect of the invention, each subsequent feature width is smaller than the next larger feature width by an increment that is a predetermined percent of said first resolvable feature width. In another aspect, the first resolvable feature width is the minimum width known to be resolvable by the lithographic process.

According to another aspect of the invention, the test features may comprise substantially opaque features, or may comprise substantially transmissive features.

In yet another aspect of the invention, the test features may comprise lines or spaces. According to another aspect of the invention, the distance between each adjacent test feature is at least about five times the optical radius.

According to yet another aspect of the invention, one of said plurality of test features has a non-resolvable feature width that is known to not be resolvable by the lithographic process and at least one of said plurality of test features has an intermediate feature width that is intermediate between said first resolvable feature width and said non-resolvable feature width.

In another aspect of the invention, the step of identifying comprises inspecting a scanning electron microscope image of said resist image.

According to yet another aspect of the invention, the method further comprises: providing a set of transmissive test features, determining a transmissive printability extremum intensity value and a transmissive unprintability extremum intensity value and selecting a transmissive threshold value based on a combination of said transmissive extremum intensity values; providing a set of substantially opaque test features, determining an opaque printability extreuum intensity value and an opaque unprintability extremum intensity value, and selecting an opaque threshold value based on a combination of said opaque extremum intensity values; and selecting a constant threshold value based on a combination of said opaque threshold value and said transmissive threshold value.

Other objectives, advantages and aspects of the present invention will be more readily understood and made apparent with reference to the following detailed description.

BRIEF DESCRIPTION OF THE DRAWINGS

The invention will be better understood from the following detailed description with reference to the drawings listed below, which are not necessarily drawn to scale.

FIG. 6 illustrates the relationship between Imax and the width of test features of FIG. 5 designed in accordance with the invention.

FIG. 8 illustrates cross-section views of masks having test features in accordance with the invention.

DESCRIPTION OF THE PREFERRED EMBODIMENTS

Figure 1A:
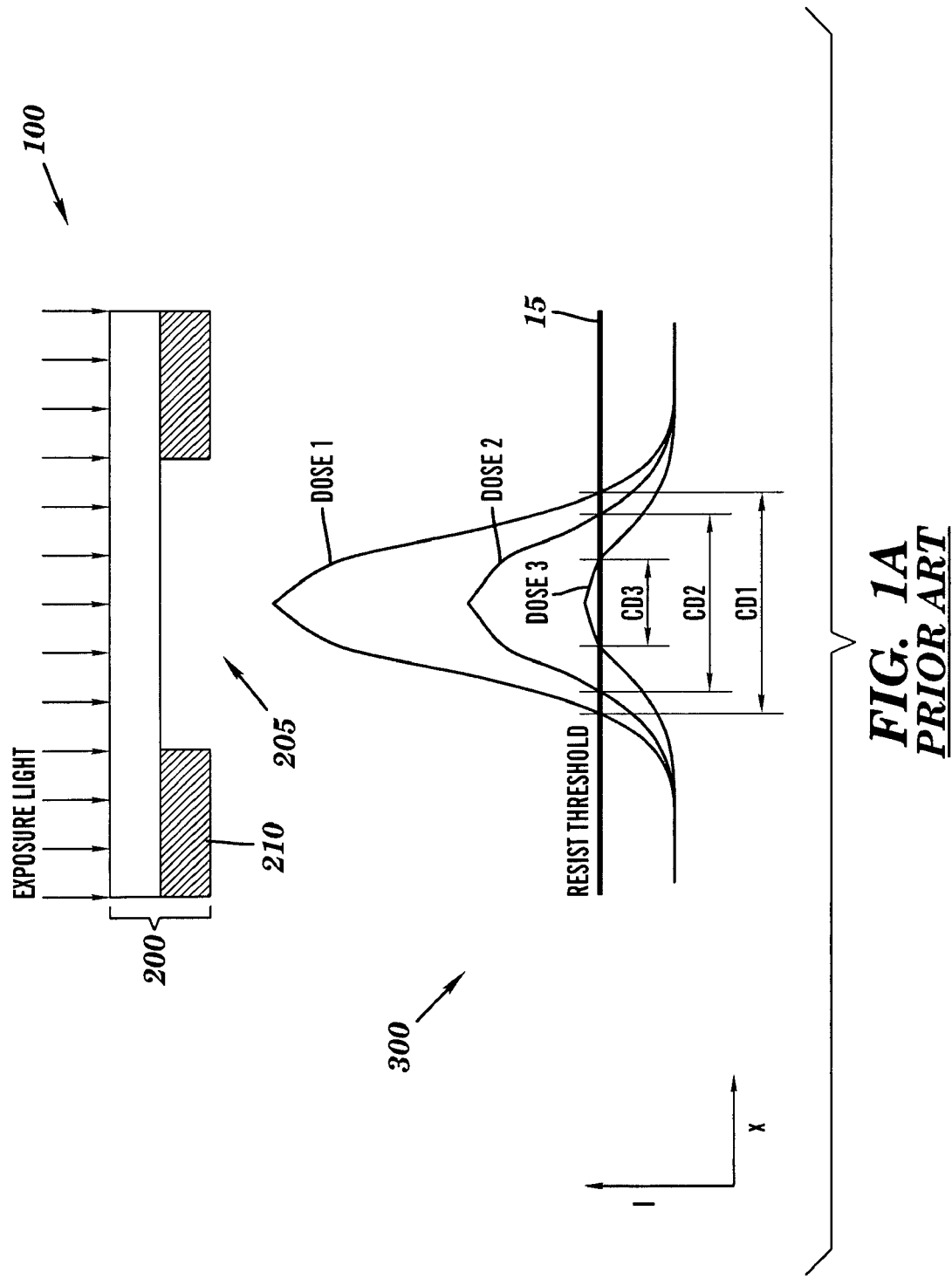
FIG. 1A illustrates the relationship between exposure dose and CD in a resist model.
Figure 1B:
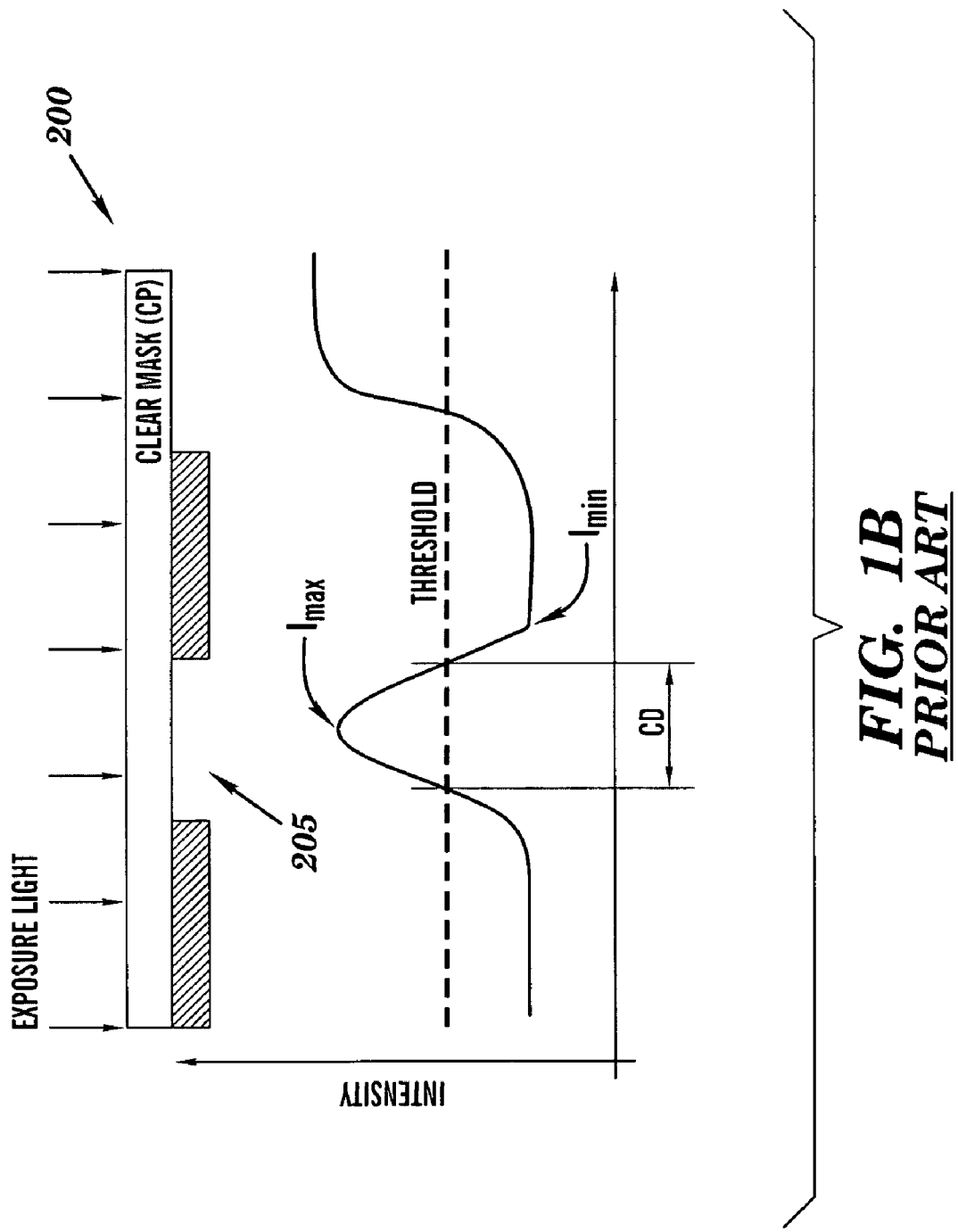
FIG. 1B illustrates the relationship between maximum intensity Imax and minimum intensity Imin associated with a mask feature.
Figure 2:
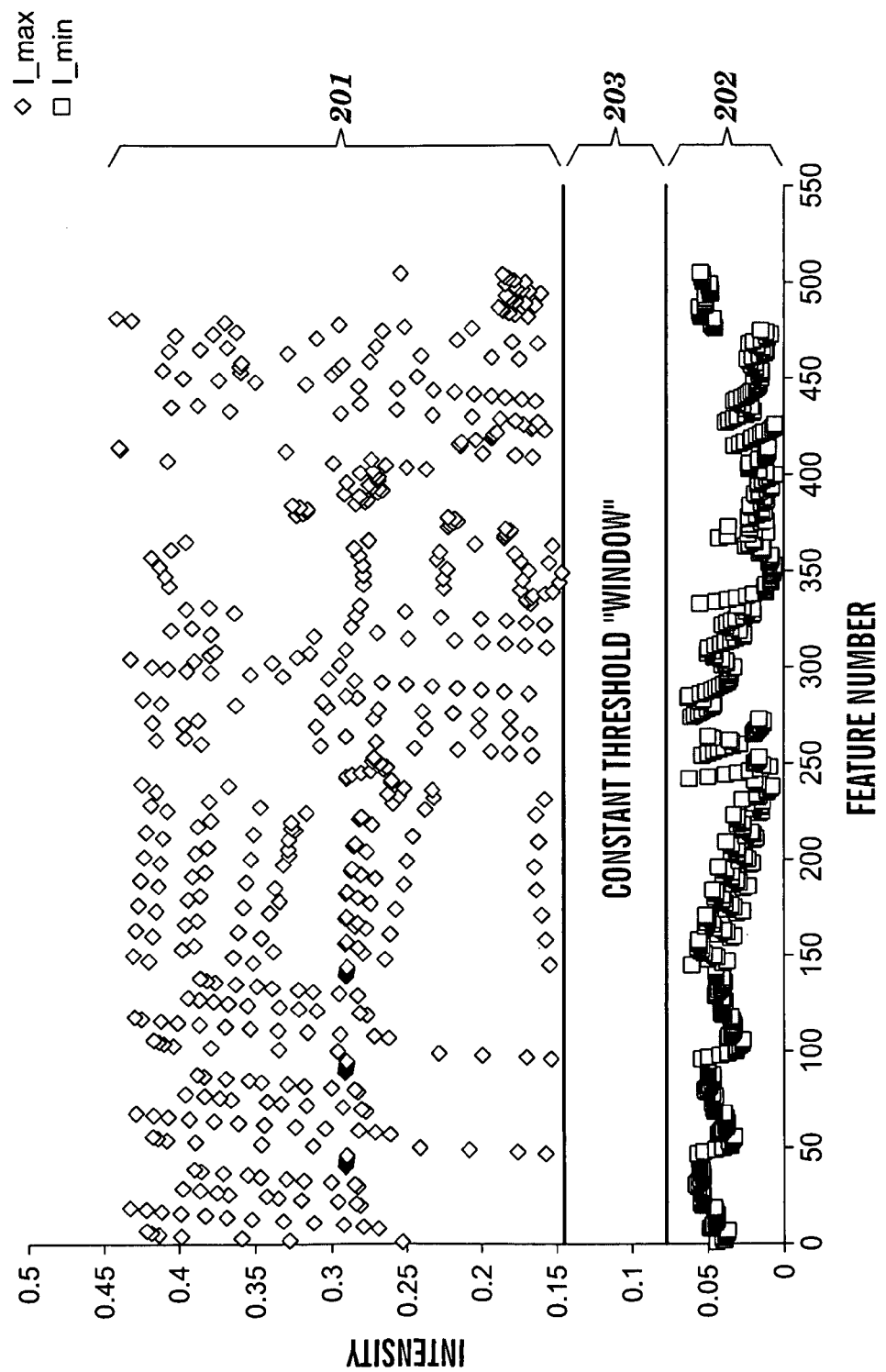
FIG. 2 is a plot of the variation of intensity associated with features of a test pattern in a conventional calibration procedure.
Figure 3:
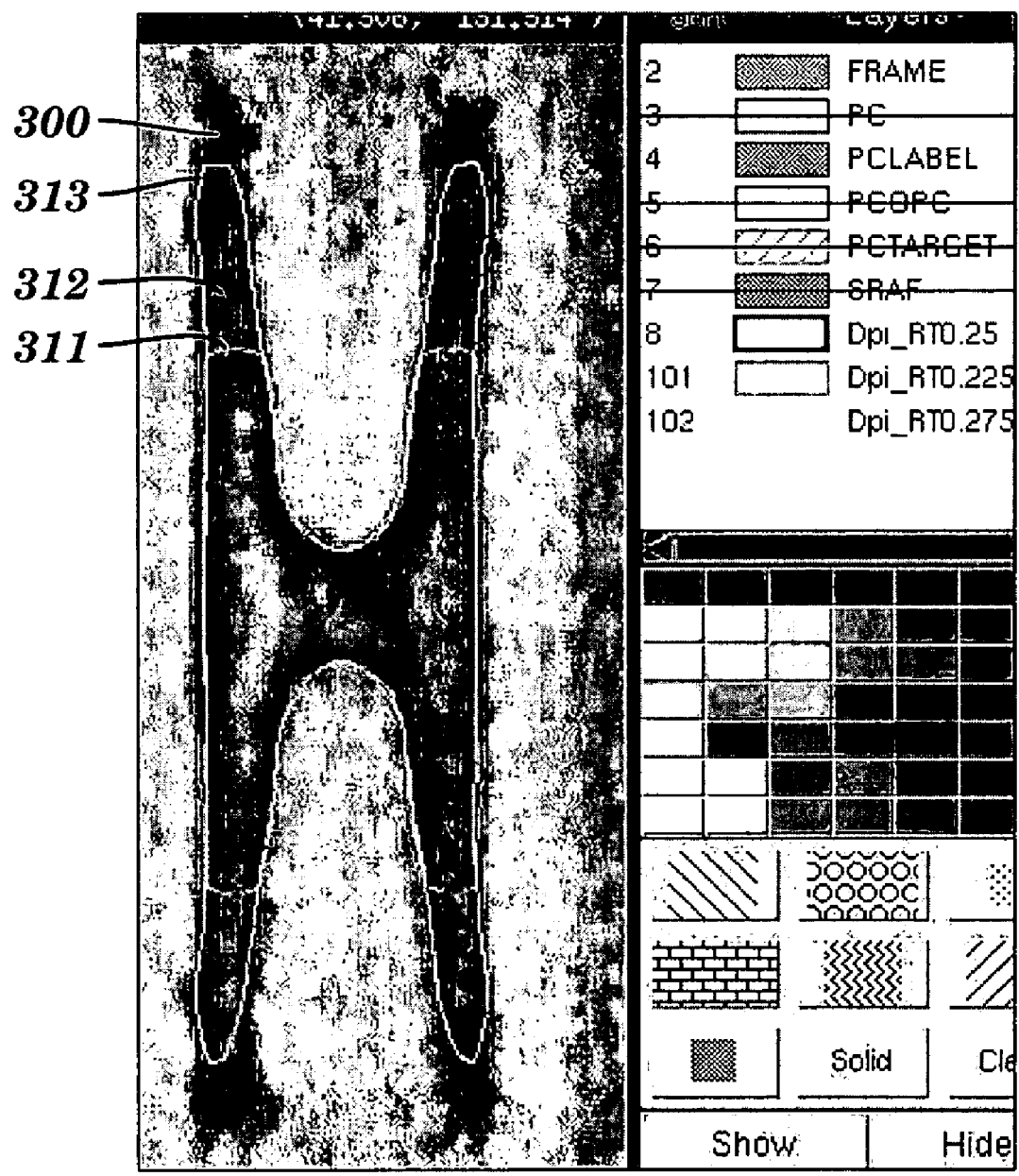
FIG. 3 illustrates the variation in simulated wafer images resulting from resist models having different constant threshold values.
Figure 4:
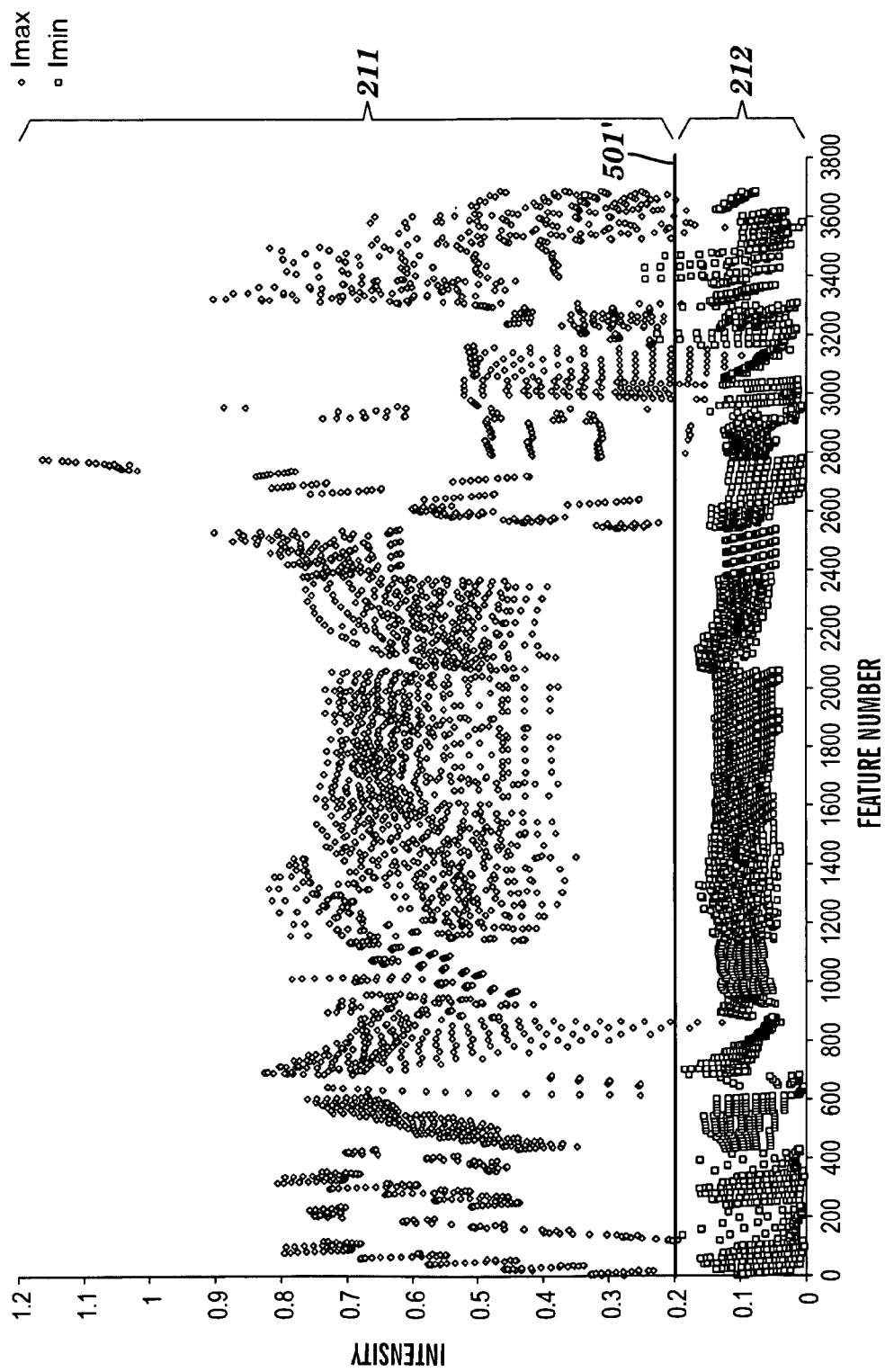
FIG. 4 is a plot of intensity values associated with features of a test pattern from a calibration procedure in accordance with the invention.

In accordance with a preferred embodiment of the invention, test patterns are provided that are specially designed to fill in the gap region 203 (FIG. 2) between the maximum resolvable Imin value ($Imin_R$) and minimum resolvable Imax ($Imax_R$) value in the plot of Imax and Imin values for the calibration test pattern, resulting, in a plot such as illustrated in FIG. 4. The intensity difference between $Imax_R$ and $Imin_R$ is referred to hereinafter as the constant threshold window $\Delta I_{win}$ 203 (see FIG. 2). The constant threshold window $\Delta I_{win}$ 203 can also be expressed in terms of contrast, which is equal to (Imax−Imin)/(Imax+Imin). In accordance with the present invention, additional feature sizes are provided in the test pattern that potentially extent beyond the resolution of the lithographic process, and can be used to obtain Imin and Imax values that provide additional calibration data that fills in the gap within the constant threshold window $\Delta I_{win}$ 203.

In accordance with one embodiment of the invention, test patterns are provided that include features that have dimensions ranging from known resolvable space and widths. Such known resolvable dimensions may be determined empirically or by simulation the known sensitivity of a resist for a given lithographic process. For example, in the case of a positive resist, the known resolvable width of a substantially opaque line $CD_L$ is a feature that prints with a minimum intensity Imin (see FIG. 9) of $Imin_R$. Similarly, the known resolvable width $CD_S$ of a transmissive space is a space that prints with a maximum intensity Imax (see FIG. 6) of $Imax_R$. $CD_L$ and $CD_S$ may be determined empirically or by simulation. In accordance with the invention, additional test patterns are provided that have widths and spaces that are incrementally smaller than the known resolvable width $CD_L$ and known resolvable space $CD_S$. The resulting Imin and Imax values for the inventive test patterns having features that approach or exceed the resolution of the lithographic process may be used in accordance with the present invention to identify a more accurate single value for the constant threshold.

In accordance with a preferred embodiment of the invention, additional feature sizes are provided in the test pattern that incrementally decreases the width or spaces by a fraction of the known resolvable dimension. In one embodiment according to the invention, an increment of 10% of the known resolvable dimension is preferred, however the invention is not so limited, and any suitable increment may be used. For example, test patterns for obtaining additional calibration values for Imin, in the case of positive resist, would vary from the resolvable width $CD_L$ in increments of 0.1 $CD_L$, while holding the width of intermediate transmissive regions constant. This effectively varies Imin below the minimum resolvable Imin, while holding Imax constant. Similarly, test patterns for obtaining additional calibration values for Imax, in the case of positive resist, would vary from the known resolvable space $CD_S$ in increments of 0.1 $CD_S$, while holding the width of intermediate opaque regions constant. This effectively varies Imax below the minimum resolvable Imax, while holding Imin constant. The number of increments is preferably greater than 2.

Figure 5:
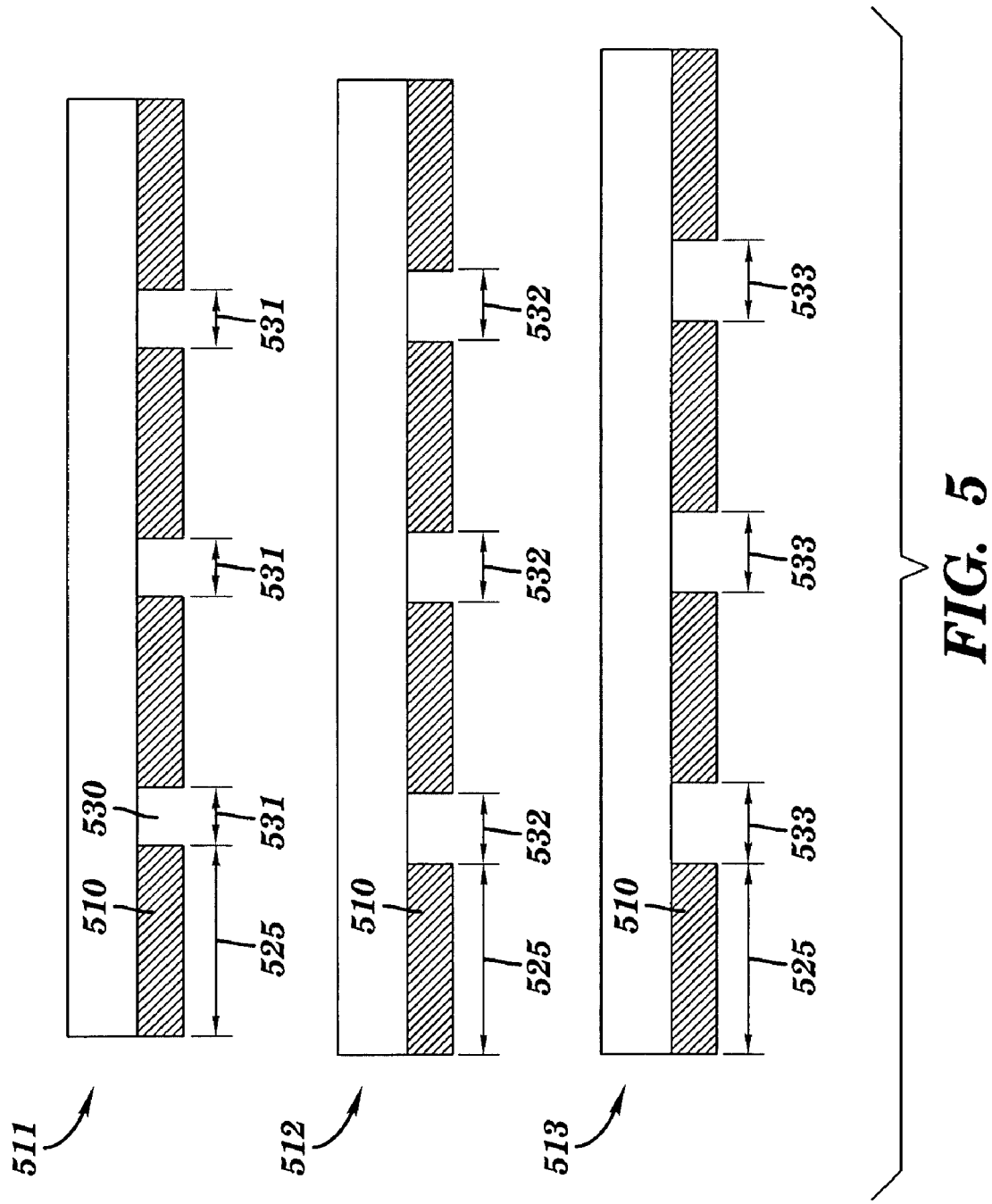
FIG. 5 illustrates cross-section views of masks having test features in accordance with the invention.

For example, FIG. 5 illustrates a cross-section view of test patterns 511, 512, 513 formed on a mask in accordance with the invention, for the case of a bright field mask and positive resist. Each pattern comprises background definition features 510, which in this example are substantially opaque features representing lines 510 having a relatively wide constant line width 525. References to opaque features or substantially opaque are intended to refer to features that are substantially opaque relative to a background field that is substantially transmissive. The width 525 of each background definition feature 510 is sufficiently large so that Imin is maintained at a minimum value Imin0, e.g. close to or equal to zero. Preferably, the width of background definition features 510 is at least about 5 times the optical radius. The optical radius is the distance from a mask feature at which the optical influence of features beyond that distance will have a relatively insignificant effect. The optical radius may be approximated by $1.12/(\sigma\lambda/NA)$, where $\sigma$ is the degree of illumination coherence (as known in the art, a small value of $\sigma$ corresponds to coherent light, while a large value of $\sigma$ corresponds to incoherent light; preferably the light source is coherent, having $\sigma$ typically in the range of about 0.6 to 1.0). $\lambda$ is the wavelength of the illumination energy, and NA is the numerical aperture of the optical system. For example, in the case of $\lambda=193$ nm, numerical aperture NA=1, $\sigma=1$, the optical radius is about 200 nm.

In the example illustrated in FIG. 5, three (3) test patterns were used, 513, 512, 511 are provided, each having a substantially transmissive feature 533, 532, 530 defined between two background, substantially opaque, definition features 510, and that varies in width between the test patterns 513, 512, 511. For example, in a first pattern 513, the space 533 has a width equal to a known resolvable width $CD_S$, the space 532 in pattern 512 has a width equal to $CD_S$–0.1 $CD_S$, and the space 530 has a width equal to $CD_S$–0.2 $CD_S$.

In accordance with the invention, a sufficient number of incrementally varying test patterns are provided so that the resulting printed patterns will incrementally range from being resolved to being unresolved. The incrementally varying test patterns are provided so that the test features have widths that vary from a starting resolvable width to an ending width that is clearly not resolvable. The starting resolvable width is preferably determined by the Raleigh limit which is given by $\lambda/(4NA)$, where $\lambda$ is the wavelength of the illumination energy, NA is the numerical aperture. For 45 nm technology, $\lambda=193$ nm. The numerical aperture of the optical system may range from about 0.45 to 1.3, where the NA may be above 1 for immersion lithography. The first test pattern has first test features having a starting width that is preferably chosen so that the Imax value will be above the resist print threshold, as determined by the optical model.

Referring to FIG. 6, test pattern 513 having a starting test feature having a relative large starting width 533, which is preferably a known resolvable space (i.e. substantially transmissive in this example) width $CD_S$, which should result in an Imax3 that is above the resist threshold 501 to be determined during this calibration procedure, and should be easily resolvable. References to transmissive or substantially transmissive features are intended to refer to features that are substantially transmissive relative to a background field that is substantially opaque. Test pattern 512 comprises a test feature 532 having an intermediate width that should have a smaller Imax2, but which may still be resolvable. Test pattern 511, comprises a test feature 531 having an ending width that preferably does not result in an Imax1 sufficiently above the resist threshold 501 to provide a resolvable pattern. According to a preferred embodiment of the invention, the test patterns are provided so that the widths of the test features will vary by 2 to 10 increments from a known resolvable width to an un-resolvable width, thus varying the Imax through the constant threshold window $\Delta I_{win}$ 203 (see FIG. 2).

Figure 7A:
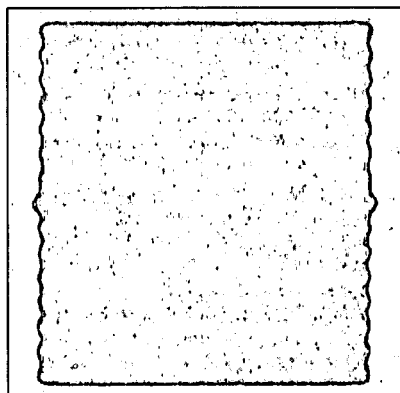
FIG. 7 illustrates SEM images of test patterns designed and used in accordance with the invention.
Figure 7B:
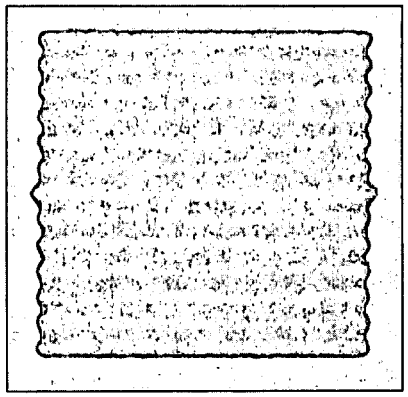
Figure 7C:
Figure 7D:
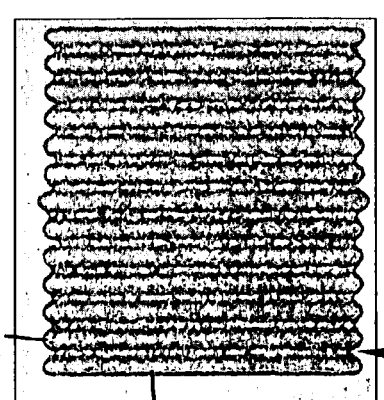
Figure 7E:
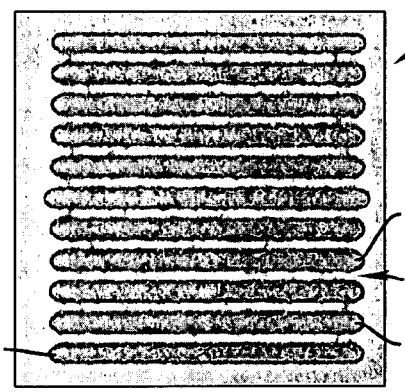
Figure 7F:
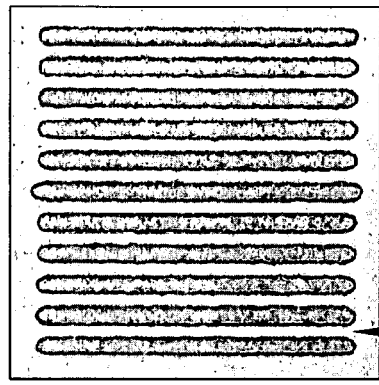

An example of SEM images 71, 72, 73, 74, 75, 76 of printed test patterns designed in accordance with the invention is illustrated in FIGS. 7A through 7F, wherein opaque background definition features 510 represent lines having a width sufficiently wide such that Imin will have a relatively constant minimum value Imin0. The spacing between opaque features 510 increases incrementally from FIG. 7A to 7F, where the spacing represents test features, and the width of the largest space 533 in the pattern 76 (FIG. 7F) is a known resolvable space width $CD_S$. Inspection of the SEM images indicates that the first acceptable resolvable test feature pattern occurs for the fifth image 75 (FIG. 7E). The Imax value Imax(E) corresponding to the space (test feature) 509 between opaque background definition features 510 in the fifth image 75 (FIG. 7E) is therefore deemed to be above the constant threshold value, hereinafter referred to as a first transitional Imax value. On the other hand, the fourth image 74 (FIG. 7D) contains test features that are somewhat resolvable, but the image quality is not as good as in the fifth image 75 (FIG. 7E). Therefore, the Imax value Imax(D) corresponding to the space (test feature) 508 between opaque background definition features 510 in the fourth image 74 (FIG. 7D) is deemed to be less than or close to the constant threshold, hereinafter referred to as a second transitional Imax value. The values of the first and second transitional Imax values, e.g. Imax(D) and Imax(E), may be determined by using an optical model to simulate the images for each of the test patterns used to form images 74, 75, respectively.

According to another embodiment of the invention, the test patterns are designed to incrementally vary Imin while maintaining Imax at a relatively constant maximum value ImaxM. For example, FIG. 8 illustrates design principles for providing a second set of test patterns to incrementally vary Imin through the limit of process resolution in accordance with a preferred embodiment of the invention. FIG. 8 illustrates a cross-sectional view of a portion of three test patterns 611, 612, 613, to be used in accordance with the invention. In this example, each pattern 611, 612, 613 has transparent or transmissive background definition features 605 having constant width 625 that is sufficiently wide so that Imax will be relatively constant at a maximum value ImaxM. According to a preferred embodiment, the first test pattern 613 comprises substantially opaque test features 623 that have a width $CD_L$ that is known to be resolvable by the lithographic process. Substantially opaque test features 622 associated with a second pattern 612 have a width 632 that is smaller than the width $CD_L$ 633 of the substantially opaque test features 623 in the first pattern 613, preferably by a predetermined increment. For example, in a preferred embodiment, the width 632 is $CD_L$–0.1 $CD_L$. Opaque test features 621 associated with a third pattern 611 has a width 631 that is too small to be resolvable. In a preferred embodiment, the width 631 is $CD_L$–$n\alpha CD_L$, where n is an increment number, and a is a predetermined incremental fraction.

Figure 9:
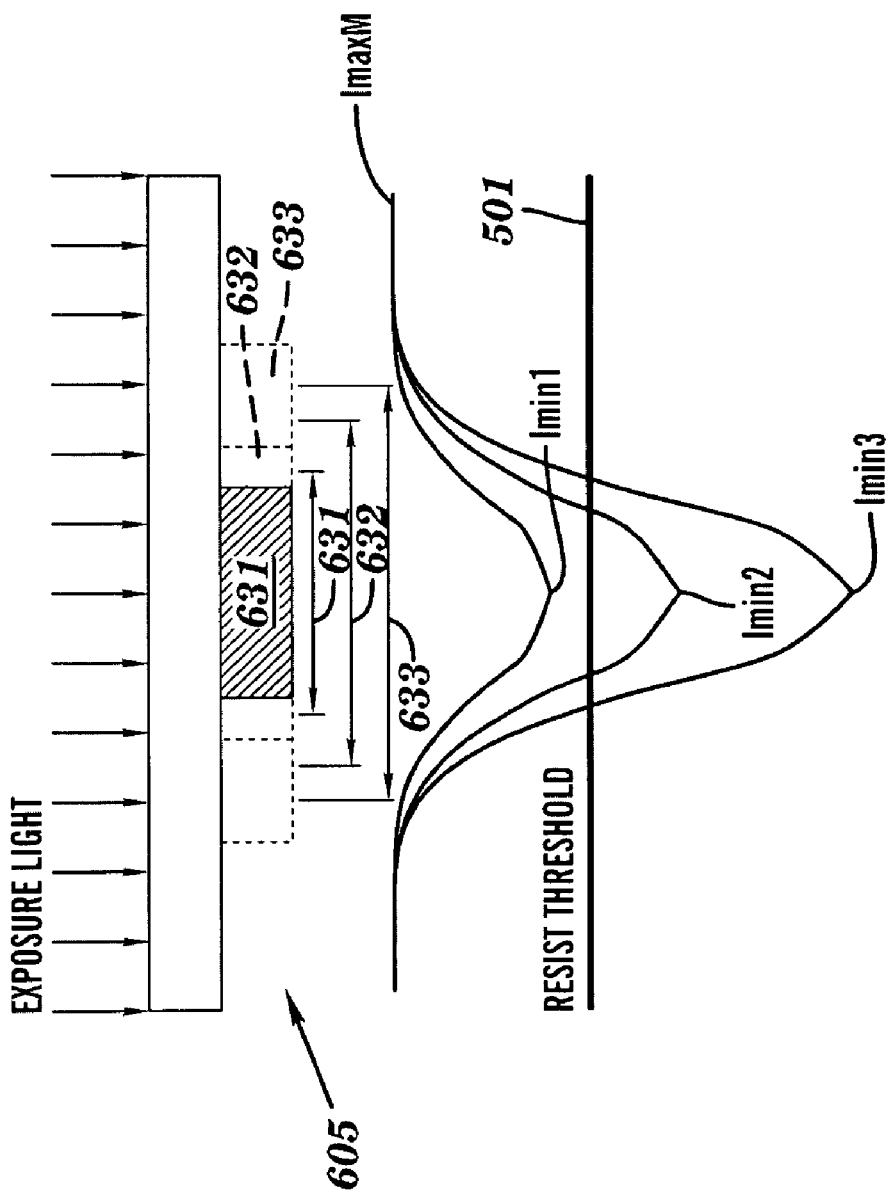
FIG. 9 illustrates the relationship between Imin and the width of test features of FIG. 8 designed in accordance with the invention.

Thus, referring to FIG. 9, first test pattern 613 having a relatively large opaque test feature width 633 that results in an Imin3 that is significantly below the resist threshold 501 (which value is unknown during this calibration procedure), and should be easily resolvable. Test pattern 612 having a smaller opaque test feature width 632 should have a larger Imin2, but which is still resolvable. Test pattern 611 comprises test features 621 having an even smaller opaque test feature width 631 that does not result in an Imin1 sufficiently below the resist threshold 501 to provide a resolvable pattern. According to a preferred embodiment of the invention, the test patterns are provided so that the width of the test patterns will varying by at least 2 to 10 increments through the constant threshold window 203 (see FIG. 2).

Figure 10C:
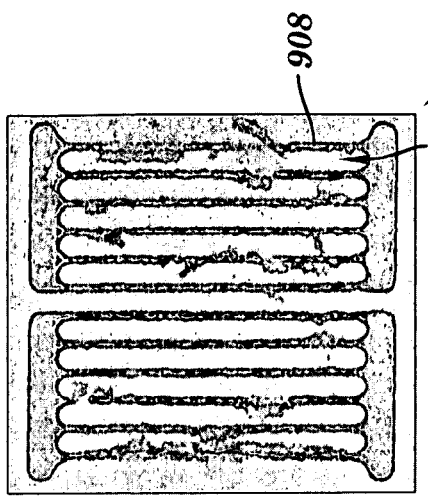
FIG. 10 illustrates SEM images of test patterns designed and used in accordance with the invention.
Figure 10B:
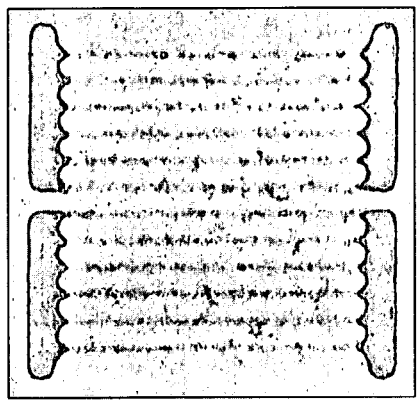
Figure 10A:
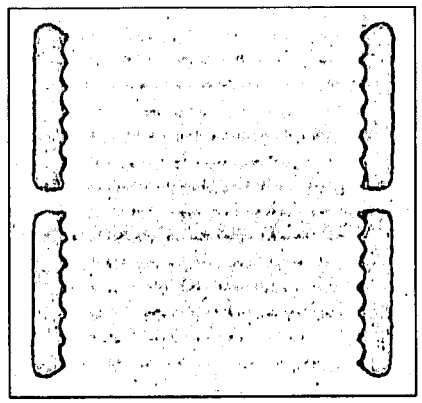
Figure 10E:
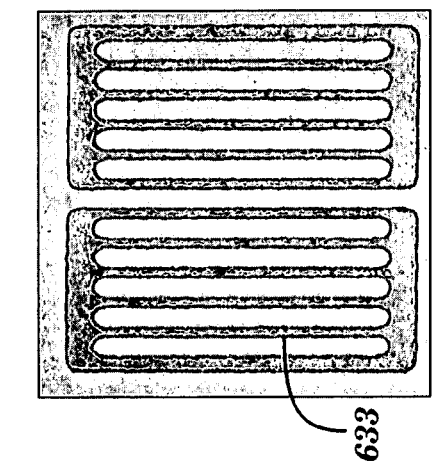
Figure 10D:
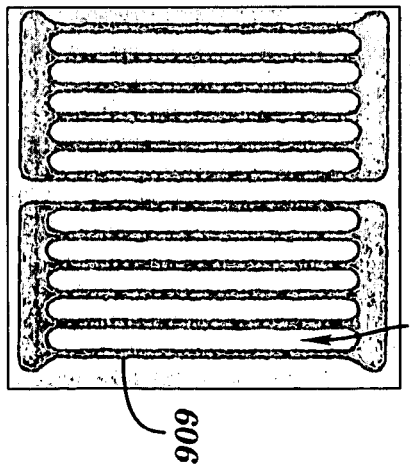

An example of SEM images 91, 92, 93, 94, 95 of printed test patterns designed in accordance with the present invention is illustrated in FIGS. 10A through 10E, respectively. The features 605 represent a repeating transmissive background definition feature having a width sufficiently wide such that Imax will have a relatively constant maximum value ImaxM. The features 605 are separated by opaque test features that have widths that decrease incrementally in each test pattern corresponding from FIGS. 10E to 10A, respectively. The pattern 95 (FIG. 10E) has an feature width 633 that is known to be resolvable. Inspection of the SEM images indicates that the first acceptable resolvable test pattern occurs for the fourth image 94 (FIG. 10D). The Imin value Imin(D) (hereinafter referred to as a first transitional Imin value) corresponding to the opaque feature 909 between substantially transmissive features 605 in the fourth image 94 (FIG. 10D) is therefore deemed to be below the constant threshold value 501 that is to be determined in this calibration. On the other hand, the third image 93 (FIG. 10C) is somewhat resolvable, but there is clear evidence of pattern collapse, thus the image quality is not as good as in the fourth image 94 (FIG. 10D). Therefore, the Imin value Imin(C) (hereinafter referred to as a second transitional Imin value) corresponding to the opaque features 908 between transmissive features 605 in the third image 93 (FIG. 10C) is deemed to be greater than or close to the constant threshold 501. The first and second transitional Imin values, e.g. Imin(C) and Imin(D), may be determined by using an optical model to simulate the images for each of the test patterns used to form images 93, 94, respectively.

In accordance with the invention, an estimated constant threshold value 501' may be chosen based on the first and second transitional Imax and Imin values associated with the test patterns. The estimated constant threshold 501' is preferably chosen to lie between the first and second transitional Imax values and also between the first and second transitional Imin values. For example, in examining the value of the transitional Imin values corresponding to the SEM images of FIGS. 10C and 10D, Applicant found that Imin of the pattern in image 93 (FIG. 10C) Imin(C) is above 0.2, while Imin for the pattern in image 94 (FIG. 10D) Imin(D) is below 0.2. Similarly, in examining the transitional Imax values corresponding to the SEM images of FIGS. 7C and 7D, Applicant found that Imax of the pattern in image 73 (FIG. 7C) Imax(C) is less than 0.2, while the Imax of the pattern in image 74 (FIG. 7D) Imax(D) is greater than 0.2. Thus, an estimated constant threshold value 501' was selected to be equal to 0.2, as indicated in FIG. 4. The incremental difference in widths of the test features among each test pattern according to the invention should be sufficiently small that even if the values between transitional Imax and Imin do not overlap, the values should be sufficiently close that an intermediate or average of the transitional Imax and Imin values will provide a sufficiently accurate constant threshold.

Figure 11:
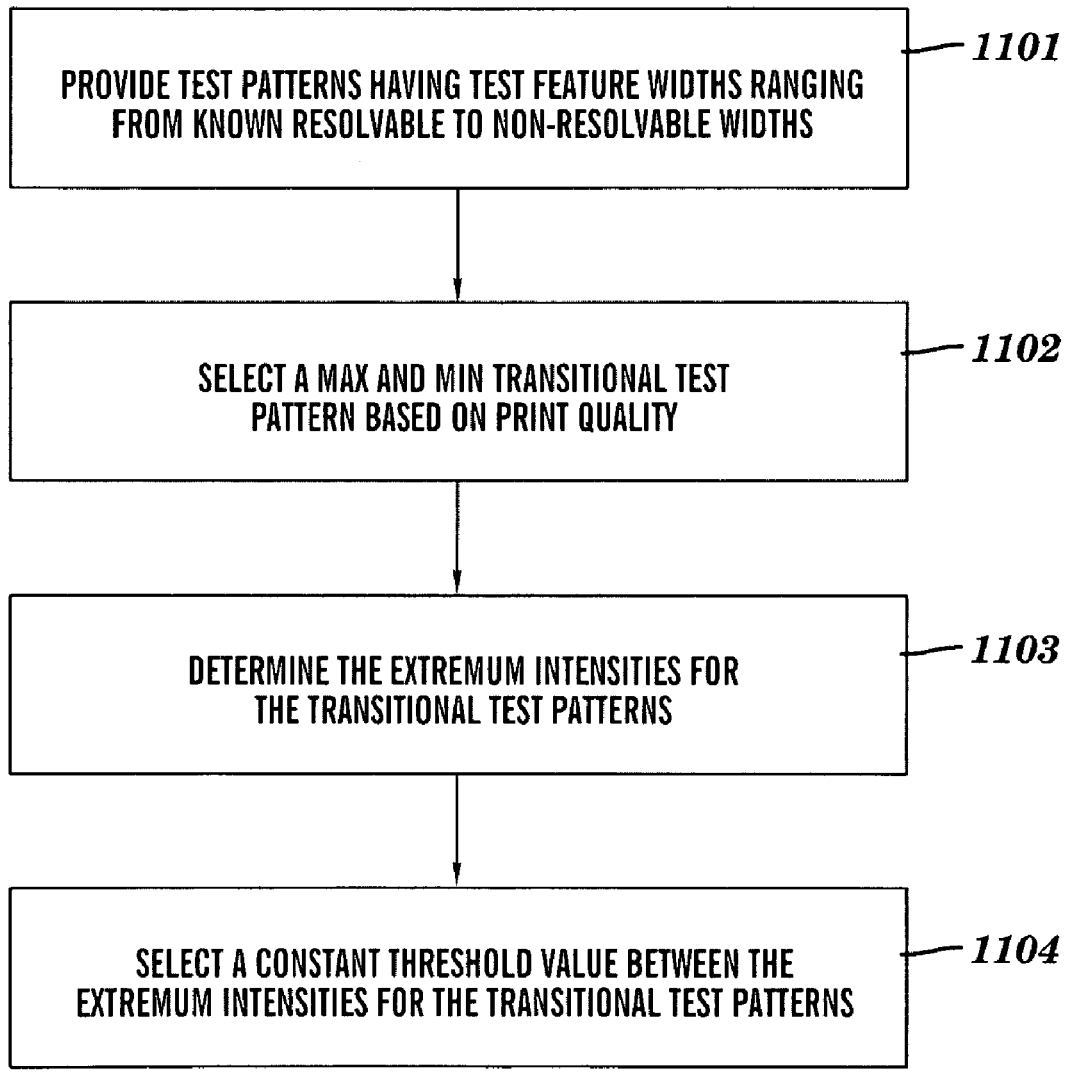
FIG. 11 illustrates a flow chart of an embodiment of the calibration method in accordance with the invention.

A preferred embodiment of the method according to the invention is illustrated in FIG. 11. Test patterns are provided that have test feature widths that range from a known resolvable width incrementally to a non-resolvable width (Block 1101). The known resolvable width may be selected to be about the minimum width (CD) that is known to be resolvable by the lithographic process. This is about the minimum width typically provided during conventional calibration procedures. The set of test patterns include widths that vary incrementally from the known resolvable width to a width that will be unresolvable. In a preferred embodiment, each width is incrementally smaller than the known resolvable width by a predetermined fraction or percentage of the known resolvable width. The known resolvable width may be selected by performing simulation and/or empirical tests to determine a suitable starting width for the test patterns according to the invention. Preferably, at least 2 intermediate patterns are provided.

The test patterns are printed, and examined to determine the printability of the test features (Block 1102). A maximum transitional test pattern is selected if the test pattern is printed with acceptable resolution and the next test pattern (the minimum transitional test pattern) having the next incremental width test features does not print with acceptable resolution. This may be done, for example, by inspecting a scanning electron microscope (SEM) image of the printed test patterns.

The extremum intensities (e.g. Imin, Imax) are determined for incrementally varied feature widths associated with the corresponding maximum and minimum transitional test patterns (Block 1103). Typically this will be determined by simulation of the transitional test patterns using an optical model.

Then, a constant threshold value for the resist model may be chosen from a combination of the extremum intensities determined for the maximum and minimum transitional test patterns (Block 1104). For example, the constant threshold value may be selected to be the average of the extremum of the two transitional test patterns.

The additional patterns according to the invention are specifically designed to print features that approach or exceed the resolution of the lithographic process, and range from known resolvable patterns to patterns that are expected to fail to be resolved. By contrast, in prior art practice, modeling engineers do not intentionally use test patterns that include feature dimensions that are likely to fail, but rather only choose patterns that are not intended to fail.

Thus, the method according to the invention provides an improved method of determining the value of the constant threshold to be used in resist models for use in lithographic modeling applications, such as OPC or mask verification. According to a preferred embodiment of the invention, the method adds calibration patterns that approach or exceed the resolution limits of the lithographic process, and incrementally varies the width of test features to span the gap between the maximum Imin and minimum Imax values for resolvable features.

Other modifications and variations in the invention will be apparent to those skilled in the art from the foregoing disclosure. Thus, while only certain embodiments of the invention have been specifically described herein, it will be apparent that numerous modifications may be made thereto without departing from the spirit and scope of the invention.

The invention claimed is:

1. A method of calibrating a model of a lithographic process, the method comprising the steps of:
    providing a plurality of test features of a first tone each of said test features having a different feature width each defined by a distance between two adjacent background features of a second tone, wherein a first of said test features has a first resolvable feature width that is known to be resolvable by the lithographic process, and each subsequent one of said plurality of test features comprises a subsequent feature width that is smaller than said first resolvable feature width and different than any other feature width of said plurality of test features;
    forming a resist image of said plurality of test features according to the lithographic process;
    identifying from among said plurality of test features in said resist image a first printable feature width in accordance with an acceptable printability criterion and a first unprintable feature width in accordance with an unacceptable printability criterion;
    determining a printability extremum intensity value associated with said first printable feature width and an unprintability extremum intensity value associated with said first unprintable feature width; and
    selecting a constant threshold value based on a combination of said extremum intensity values, said constant threshold value for use in a constant threshold model of behavior of said resist in said lithographic process.

2. The method of claim 1, further comprising providing a plurality of test patterns wherein each of said test patterns comprises a plurality of one of said plurality of test features having a given feature width.

3. The method of claim 1, wherein each subsequent feature width is smaller than the next larger feature width by an increment that is a predetermined percent of said first resolvable feature width.

4. The method of claim 1, wherein said first resolvable feature width is the minimum width known to be resolvable by the lithographic process.

5. The method of claim 1, wherein said test features comprise lines.

6. The method of claim 1, wherein said test features comprise substantially opaque features.

7. The method of claim 1, wherein said test features comprise spaces.

8. The method of claim 1, wherein said test features comprise transmissive features.

9. The method of claim 1, wherein the distance between each adjacent test feature is at least about five times the optical radius.

10. The method of claim 1, wherein one of said plurality of test features has a non-resolvable feature width that is known to not be resolvable by the lithographic process and at least one of said plurality of test features has an intermediate feature width that is intermediate between said first resolvable feature width and said non-resolvable feature width.

11. The method of claim 1, wherein said step of identifying comprises inspecting a scanning electron microscope image of said resist image.

12. The method of claim 1, further comprising:
    providing a set of transmissive test features, determining a transmissive printability extremum intensity value and a transmissive unprintability extremum intensity value and selecting a transmissive threshold value based on a combination of said transmissive extremum intensity values;
    providing a set of substantially opaque test features, determining an opaque printability extreumum intensity value and an opaque unprintability extremum intensity value, and selecting an opaque threshold value based on a combination of said opaque extremum intensity values; and
    selecting a constant threshold value based on a combination of said opaque threshold value and said transmissive threshold value.

* * * * *